(12) United States Patent
Seo et al.

(10) Patent No.: US 8,084,371 B2
(45) Date of Patent: Dec. 27, 2011

(54) FIELD EFFECT TRANSISTORS, METHODS OF FABRICATING A CARBON-INSULATING LAYER USING MOLECULAR BEAM EPITAXY AND METHODS OF FABRICATING A FIELD EFFECT TRANSISTOR

(75) Inventors: David Seo, Yongin-si (KR); Jai-kwang Shin, Anyang-si (KR); Sun-ae Seo, Hwaseong-si (KR)

(73) Assignees: Samsung Electronics Co., Ltd., Gyeonggi-do (KR); The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 12/923,240

(22) Filed: Sep. 10, 2010

(65) Prior Publication Data

US 2011/0121409 A1    May 26, 2011

(30) Foreign Application Priority Data

Nov. 23, 2009   (KR) .................. 10-2009-0113361

(51) Int. Cl.
*H01L 21/31*     (2006.01)
*H01L 21/469*    (2006.01)
*H01L 21/8236*   (2006.01)

(52) U.S. Cl. .................. 438/778; 438/278; 257/E21.27; 257/E21.409

(58) Field of Classification Search .................. 438/778, 438/287; 257/E21.27, E21.409
See application file for complete search history.

(56) References Cited

U.S. PATENT DOCUMENTS

| | | | |
|---|---|---|---|
| 6,621,535 B1 | 9/2003 | Fukuda | |
| 7,355,247 B2 | 4/2008 | Shaheen et al. | |
| 7,687,876 B2 * | 3/2010 | Kabir | 257/471 |
| 2006/0011942 A1 * | 1/2006 | Kim et al. | 257/192 |
| 2006/0220028 A1 | 10/2006 | Shaheen et al. | |
| 2007/0026536 A1 | 2/2007 | Kim et al. | |

FOREIGN PATENT DOCUMENTS

| | | |
|---|---|---|
| JP | 62-29166 | 2/1987 |
| JP | 06-13315 | 1/1994 |
| JP | 11-307782 | 11/1999 |
| JP | 2000-353307 | 12/2000 |
| JP | 2007-67048 | 3/2007 |
| KR | 10-2007-0014699 | 2/2007 |

* cited by examiner

*Primary Examiner* — Alexander Ghyka
*Assistant Examiner* — Seahvosh Nikmanesh
(74) *Attorney, Agent, or Firm* — Harness, Dickey & Pierce, P.L.C.

(57) ABSTRACT

Field effect transistors, methods of fabricating a carbon insulating layer using molecular beam epitaxy and methods of fabricating a field effect transistor using the same are provided, the methods of fabricating the carbon insulating layer include maintaining a substrate disposed in a molecular beam epitaxy chamber at a temperature in a range of about 300° C. to about 500° C. and maintaining the chamber in vacuum of $10^{-11}$ Torr or less prior to performing an epitaxy process, and supplying a carbon source to the chamber to form a carbon insulating layer on the substrate. The carbon insulating layer is formed of diamond-like carbon and tetrahedral amorphous carbon.

19 Claims, 4 Drawing Sheets

FIELD EFFECT TRANSISTORS, METHODS OF FABRICATING A CARBON-INSULATING LAYER USING MOLECULAR BEAM EPITAXY AND METHODS OF FABRICATING A FIELD EFFECT TRANSISTOR

CROSS-REFERENCE TO RELATED APPLICATIONS

This application claims the benefit of priority under 35 U.S.C. §119 from Korean Patent Application No. 10-2009-0113361, filed on Nov. 23, 2009, in the Korean Intellectual Property Office, the disclosure of which is incorporated herein in its entirety by reference.

BACKGROUND

1. Field

Example embodiments relate to field effect transistors, methods of fabricating a carbon insulating layer using molecular beam epitaxy and methods of fabricating a field effect transistor using the same.

2. Description of the Related Art

Graphene is electrically, mechanically and chemically stable, and highly conductive. As such, graphene is used as a basic material in an electronic circuit. In general, graphene is prepared by chemical vapor deposition wherein a carbon source is provided on a metal catalyst layer, or by thermally decomposing a silicon carbide (SiC) substrate.

A passive insulating layer is easily formed on a silicon substrate by natural oxidation, or heat treatment. However, it is difficult to form an insulating layer on other substrates (e.g., a germanium (Ge) substrate, or a gallium arsenide (GaAs) substrate) by heat treatment or oxidation.

Molecular beam epitaxy (MBE) is used to form a solid thin film layer using vacuum deposition. MBE is carried out under ultra-high vacuum, and evaporated materials adhere onto a substrate without collision with one another.

SUMMARY

Example embodiments relate to field effect transistors, methods of fabricating a carbon insulating layer using molecular beam epitaxy and methods of fabricating a field effect transistor using the same.

Provided are field effect transistors including a gate insulating layer formed using the method of fabricating a carbon insulating layer.

Additional aspects will be set forth in part in the description which follows and, in part, will be apparent from the description, or may be learned by practice of the presented embodiments.

According to example embodiments, a method of fabricating a carbon insulating layer using molecular beam epitaxy includes disposing a substrate in a molecular beam epitaxy chamber, maintaining the substrate at a temperature in a range of about 300° C. to about 500° C., and maintaining the chamber in (or under) a high vacuum of $10^{-11}$ Torr or less, and supplying a carbon source into the chamber to form a carbon insulating layer on the substrate. The carbon insulating layer is formed of diamond-like carbon and tetrahedral amorphous carbon.

The substrate may be formed of at least one material selected from the group consisting of gallium arsenide (GaAs), gallium aluminium arsenide (GaAlAs), silicon (Si), magnesium oxide (MgO), silicon oxide ($SiO_2$), sapphire and combinations thereof.

The carbon source may be at least one selected from the group consisting of carbon tetrabromide ($CBr_4$), ethylene ($C_2H_4$), carbon atoms, methane ($CH_4$) combinations thereof. Supplying the carbon source includes supplying the carbon source into the chamber to maintain the chamber in a vacuum of about $10^{-8}$ Torr to about $10^{-8}$ Torr.

The method may include forming a second layer on the substrate, or on the carbon insulating layer. The second layer may be selected from the group consisting of a metal layer, a graphene layer, a semiconductor layer and combinations thereof.

Forming the second layer includes maintaining the substrate at a temperature in a range of about 500° C. to about 800° C.

According to example embodiments, a method of fabricating a field effect transistor includes disposing a substrate in a molecular beam epitaxy chamber, supplying a source for a channel forming layer into the chamber to form the channel forming layer on the substrate, and supplying a carbon source to the chamber to form a carbon insulating layer on the substrate. The carbon insulating layer is formed of diamond-like carbon and tetrahedral amorphous carbon. The substrate is taken out of the chamber, and then sequentially the carbon insulating layer and the channel forming layer are patterned to form a gate insulating layer and a channel layer. A gate electrode is formed on the gate insulating layer, and a source electrode and a drain electrode are formed on both (or opposing) sides of the channel layer so as to respectively contact both ends of the channel layer.

According to example embodiments, a method of fabricating a field effect transistor includes disposing a substrate in a molecular beam epitaxy chamber, supplying a source for a channel forming layer into the chamber to form the channel forming layer on the substrate, and supplying a carbon source to the chamber to form a carbon insulating layer on the substrate. The carbon insulating layer is formed of diamond-like carbon and tetrahedral amorphous carbon. The substrate is taken out of the chamber, and then a conductive layer is formed on the carbon insulating layer. The conductive layer and the carbon insulating layer are sequentially patterned to form a gate electrode and a gate insulating layer. A source electrode and a drain electrode are formed so as to respectively contact both (or opposing) ends of channel layer.

According to example embodiments, a field effect transistor includes a channel layer on a substrate, a gate insulating layer formed on the channel layer. The gate insulating layer is formed of diamond-like carbon and tetrahedral amorphous carbon. A gate electrode is formed on the gate insulating layer. A source electrode and drain electrode are respectively formed on both (or opposing) sides of the channel layer so as to respectively contact both ends of the channel layer.

The channel layer may be a graphene layer, or a Group III-V material layer.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
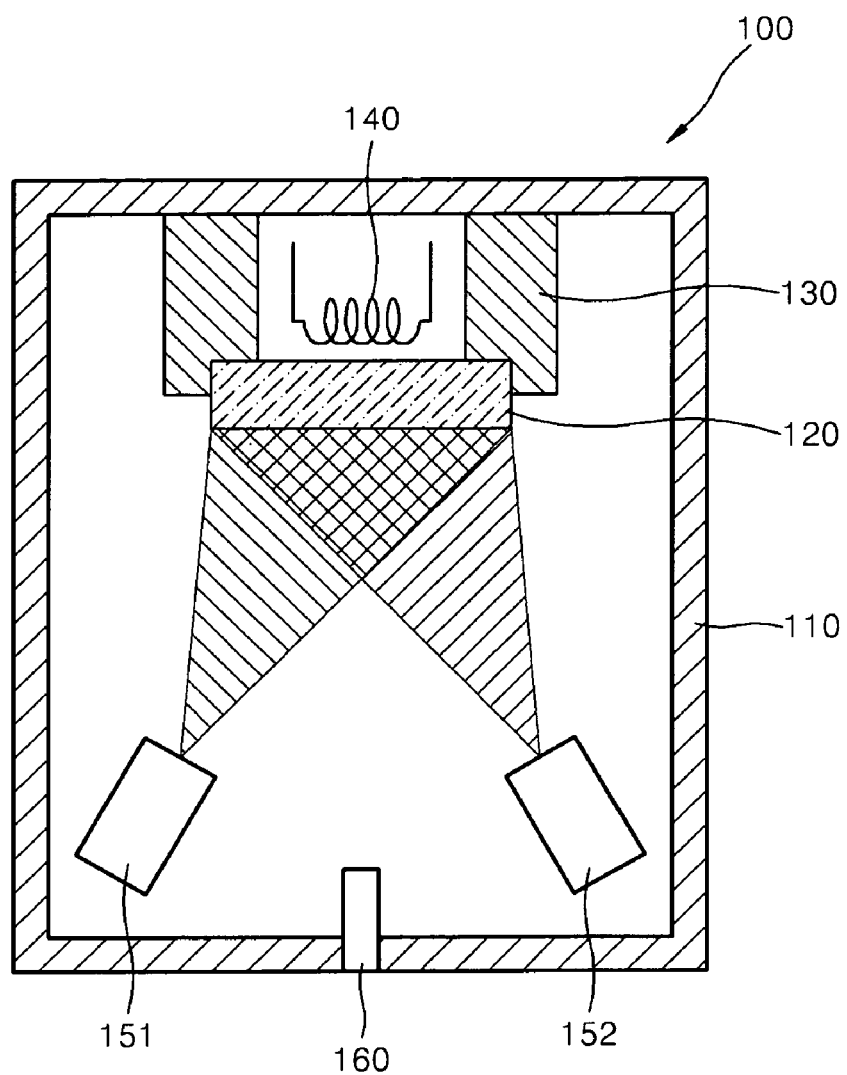
FIG. 1 is a schematic diagram of a molecular beam epitaxy apparatus according to example embodiments.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the present invention is not limited to example embodiments described.

Example embodiments relate to field effect transistors, methods of fabricating a carbon insulating layer using molecular beam epitaxy and methods of fabricating a field effect transistor using the same.

FIG. 1 is a schematic diagram of a molecular beam epitaxy apparatus 100 according to example embodiments.

Referring to FIG. 1, the molecular beam epitaxy apparatus 100 includes a substrate holder 130 for mounting a substrate 120 in a chamber 110, a heater 140 for heating the substrate 120, a first source supplier 151 for supplying a first source onto the substrate 120, and a second source supplier 152 for supplying a second source onto the substrate 120. Each of the first source supplier 151 and the second source supplier 152 includes a shutter (not shown) that selectively blocks the supply of each of the first and second sources.

The molecular beam epitaxy apparatus 100 includes a reflection high energy electron diffraction (RHEED) apparatus 160 attached thereto. The reflection high energy electron diffraction (RHEED) apparatus 160 may monitor a process of forming a single layer of an epi-layer during epitaxial growth. In other words, it can be observed that a material in-situ from the first source supplier 151 (e.g., graphene) is formed as a single layer. When only a single layer of graphene is grown, the supply of the first source from the first source supplier 151 is blocked by the shutter after the termination of the growth of the single layer of graphene.

Although not illustrated in FIG. 1, the chamber 100 includes a controller for measuring the temperature of the heater 140 and for controlling the temperature of the heater 140 to a desired temperature. The chamber 100 includes a vacuum pump (not shown) for exhausting a gas in the chamber 110 to the outside. The controller and the vacuum pump are connected to the chamber 110.

Figure 2A:
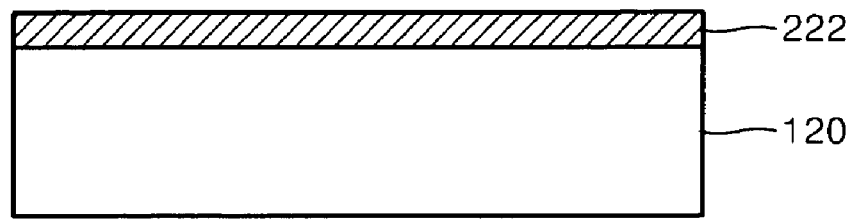
FIGS. 2A and 2B are diagrams illustrating a method of fabricating a carbon insulating layer using molecular beam epitaxy according to example embodiments.
Figure 2B:
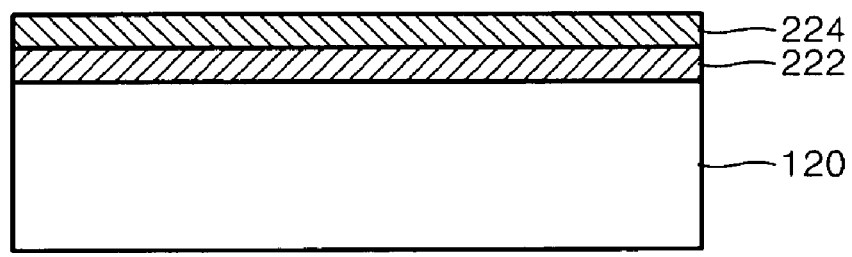

FIGS. 2A and 2B are diagrams illustrating a method of fabricating a carbon insulating layer using molecular beam epitaxy according to example embodiments.

Hereinafter, like reference numerals in FIGS. 2A and 2B refer to the like elements in FIG. 1, and therefore a detailed description thereof is not provided herein for the sake of brevity.

Referring to FIG. 2A, the substrate 120 is disposed on the substrate holder 130 in the chamber 110. The substrate 120 may be a substrate made of any one material of gallium arsenide (GaAs), gallium aluminium arsenide (GaAlAs), silicon (Si), magnesium oxide (MgO), silicon oxide ($SiO_2$), sapphire and combinations thereof. An atmosphere in the chamber 110 is controlled. The temperature of the substrate 120 is maintained in the range of about 300° C. to about 500° C. using the heater 140, and the vacuum in the chamber 110 is maintained at approximately $10^{-11}$ Torr or less using the vacuum pump before performing an epitaxy process. When the temperature of the substrate 120 is 300° C. or less, a carbon source (which will be described later) is not satisfactorily adhered onto the substrate 120. On the other hand, when the temperature of the substrate 120 is 500° C. or greater, a graphene crystalline layer may be formed from the carbon source.

A carbon source is supplied into the chamber 110 from the first source supplier 151. The carbon source may be a gas containing carbon (e.g. $CBr_4$, $C_2H_4$, $CH_4$ or combinations thereof), a carbon sublimation source or a graphite electron beam evaporation source. The carbon sublimation source may be prepared by heating a high-purity graphite filament.

As time elapses, carbon atoms adhere onto the substrate 120. The processing pressure in the chamber 110 is maintained in the range of about $10^{-9}$ to about $10^{-8}$ Torr, or $10^{-9}$ Torr to $10^{-8}$ Torr. The processing pressure is under conditions that are good enough (or sufficient) to control the adhesion state of carbon onto the substrate 120.

The RHEED 160 measures that a single layer 222 of the carbon atoms is formed on the substrate 120. When the diffraction intensity in spots of the substrate 120 is measured using the RHEED 160, it can be seen that the single layer 222 is formed when the diffraction intensity is at peak. In this regard, when the supply of the first source is blocked using the shutter of the first source supplier 151, the single layer 222 of the carbon atoms is formed (i.e., formation of the single layer 222 is complete). The single layer 222 is formed at a relatively low temperature, and thus is not in a crystalline state. The single layer 222 is formed in a mixed state of diamond-like carbon and tetrahedral amorphous carbon. The diamond-like carbon has a band gap energy in the range of about 3.0-eV to about 5.0-eV, and the tetrahedral amorphous carbon has a band gap energy in the range of 0 to about 3.0-eV. The diamond-like carbon and the tetrahedral amorphous carbon have substantially low conductivity, and thus act (or function) as an insulating layer. Hereinafter, the single layer 222 is also referred to as a carbon insulating layer 222.

Referring to FIG. 2B, when the supply of the first source from the first source supplier 151 is blocked, a second source is supplied onto the carbon insulating layer 222 from the second source supplier 152 to form a second layer 224. When the second layer 224 is formed as a graphene layer, the temperature of the substrate 120 is controlled to a range of about 500° C. to about 800° C., or 500° C. to 800° C. When the temperature of the substrate 120 is 500° C. or less, the carbon source adheres to the substrate 120, thereby being formed as the carbon insulating layer. On the other hand, when the temperature of the substrate 120 is 800° C. or greater, the speed at which the carbon source is deposited on the substrate 120 is so rapid that it may be difficult to control the thickness of the second layer 224.

The graphene layer is conductive. When the graphene layer is patterned to have a narrow width, it may act (or function) as a semiconductor layer. The second layer 224 may be a Group III-IV material layer, or a silicon germanium (SiGe) layer. When the second layer 224 is formed of two materials, the molecular beam epitaxy apparatus 100 may include a third source supplier (not shown), and thus second and third sources are supplied either simultaneously or sequentially.

Subsequently, when it is observed using the RHEED 160 that the second layer 224 is formed on the carbon insulating layer 222 to have a desired thickness, the supply of the second source is blocked using the shutter of the second source supplier 152. When the third source is supplied, the supply of the third source is also blocked.

In example embodiments, the carbon insulating layer 222 is first formed on the substrate 120, and the second layer 224 is formed on the carbon insulating layer 222. However, the stacked order is not limited thereto. Thus, the second layer 224 may be first formed on the substrate 120, and the carbon insulating layer 222 may be formed on the second layer 224.

In addition, when the processes of fabricating the carbon insulating layer 222 and the second layer 224 are repeatedly performed, a multi-layer may be formed in-situ.

The carbon insulating layer 222 may be formed on a layer formed of germanium oxide (which is unstable), or a layer formed of graphene using the method described as above. The carbon insulating layer 222 may be an insulating layer formed on an oxide layer (e.g., indium tin oxide (ITO), ruthenium oxide or iridium oxide, which are oxides with low insulation).

As described above, when the molecular beam epitaxy apparatus is used, the carbon insulating layer and the second layer are formed in-situ in the vacuum chamber. Thus, the formed material layers may have a substantially high purity.

FIGS. 3A through 3D are diagrams illustrating a method of fabricating a field effect transistor according to example embodiments.

Hereinafter, like reference numerals in FIGS. 3A and 3D refer to the like elements in the molecular beam epitaxy apparatus of FIG. 1. Thus, a detailed description thereof is not provided herein for the sake of brevity.

Figure 3A:
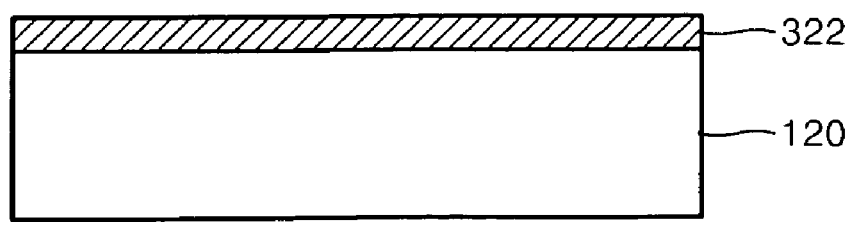
FIGS. 3A through 3D are diagrams illustrating a method of fabricating a field effect transistor according to example embodiments.

Referring to FIG. 3A, the substrate 120 is disposed on the substrate holder 130 in the chamber 110. The substrate 120 may be a substrate made of any one material of GaAs, GaAlAs, Si, MgO, $SiO_2$, sapphire or combinations thereof. The temperature of the substrate 120 is maintained in the range of about 500° C. to about 800° C. using the heater 140, and the vacuum in the chamber 110 is maintained at approximately $10^{-11}$ Torr or less using the vacuum pump.

A first source is supplied into the chamber 110 from the first source supplier 151. The first source may be a carbon source. The carbon source may be a gas containing carbon (e.g., $CBr_4$, $C_2H_4$, $CH_4$ or combinations thereof), or a carbon sublimation source. The carbon sublimation source may be prepared by heating a high-purity graphite filament.

As time elapses, carbon atoms adhere onto the substrate 120. The processing pressure in the chamber 110 is maintained in the range of about $10^{-8}$ Torr to about $10^{-8}$ Torr.

The RHEED 160 measures when a single layer of the carbon atoms is formed on the substrate 120. When the diffraction intensity in spots of the substrate 120 is measured using the RHEED 160, it can be seen that the single layer is formed when the diffraction intensity is at peak. In this regard, the supply of the first source is blocked using the shutter of the first source supplier 151. As a result, a channel forming layer 322 is formed on the substrate 120 as the single layer. The channel forming layer 322 may be a conductive graphene layer. The channel forming layer 322 may be patterned to have a width of 10-nm or less, thereby being formed as a semiconductor layer.

The channel forming layer 322 may be a Group III-V material layer, or a SiGe layer. When the channel forming layer 322 is formed of two materials in addition to carbon, the first and second sources are supplied using the first source supplier 151 and the second source supplier 152 in the molecular beam epitaxy apparatus 100.

Figure 3B:
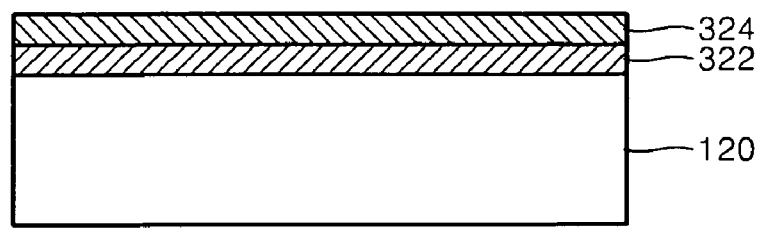

Referring to FIG. 3B, when the supply of the first source is blocked from the first source supplier 151, the temperature of the substrate 120 may be controlled in the range of about 300° C. to about 500° C. and the carbon source is supplied onto the channel forming layer 322 from the second source supplier 152, thereby being formed as a carbon insulating layer 324.

When the channel forming layer 322 is formed of two materials, the molecular beam epitaxy apparatus may include a third source supplier for supplying a source.

When it is observed using the RHEED 160 that the carbon insulating layer 324 with a desired thickness is formed on the first layer, the supply of the carbon source is blocked.

Figure 3C:
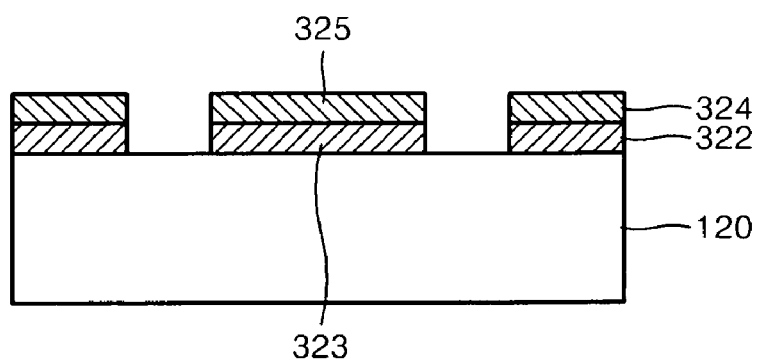

Referring to FIG. 3C, the carbon insulating layer 324 and the channel forming layer 322 are sequentially etched after the substrate 120 is taken out of the chamber 110. The patterned portion of the carbon insulating layer 324 is a gate insulating layer 325, and the patterned portion of the channel forming layer 322 is a channel layer 323.

Figure 3D:
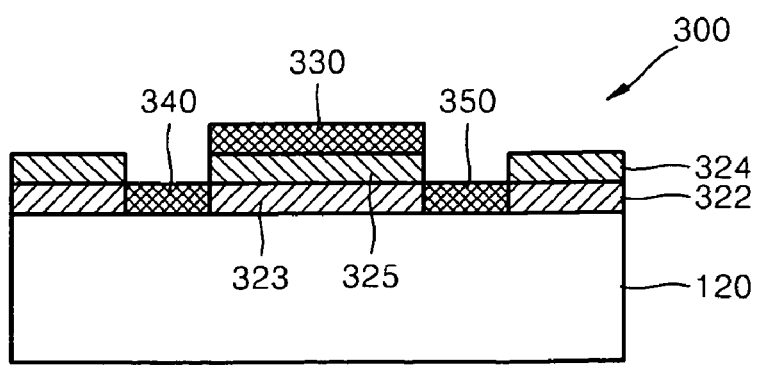

FIG. 3D is a cross-sectional view of a field effect transistor 300 according to example embodiments.

Referring to FIG. 3D, a gate electrode 330 is formed on the gate insulating layer 325 by using a photoresist, and a source electrode 340 and a drain electrode 350 are formed on the substrate 120 by using another photoresist. Alternatively, the source electrode 340 and the drain electrode 350 are first formed, and the gate electrode 330 may be then formed. These electrodes may be formed using a well-known semiconductor processing, and thus a detailed description of the method is not provided herein.

Figure 4A:
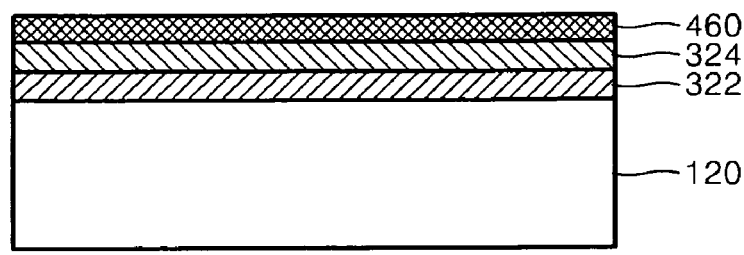
FIGS. 4A through 4C are diagrams illustrating a method of fabricating a field effect transistor according to example embodiments.
Figure 4B:
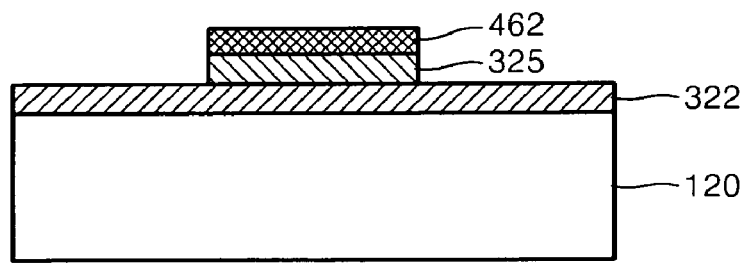
Figure 4C:
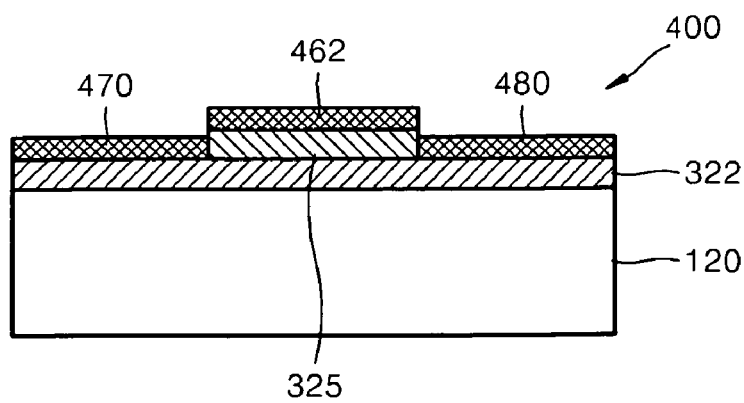

FIGS. 4A-4C are diagrams illustrating a method of fabricating a field effect transistor according to example embodiments.

Hereinafter, like reference numerals in FIGS. 4A and 4C refer to the like elements in FIGS. 3A through 3D, and thus a detailed description thereof is not provided herein.

The channel forming layer 322 and the carbon insulating layer 324 are formed on the substrate 120 using the same method as in FIGS. 3A and 3B, and thus a detailed description of the method is not provided herein. The channel forming layer 322 may be a layer formed of a Group III-V material except for graphene, or a SiGe layer.

Referring to FIG. 4A, a conductive layer 460 is formed over the substrate 120 to cover the carbon insulating layer 324. The conductive layer 460 may be formed using a sputtering method.

Referring to FIG. 4B, the conductive layer 460 and the carbon insulating layer 324 are sequentially patterned to form a patterned conductive layer 462 and a patterned carbon insulating layer 325. The patterned conductive layer 462 and the patterned carbon insulating layer 325 respectively act as a gate electrode and a gate insulating layer.

FIG. 4C is a field effect transistor according to example embodiments.

Referring to FIG. 4C, a source electrode 470 and a drain electrode 480 are respectively formed on both sides of the gate insulating layer 325 by using a general semiconductor process.

As described above, when the molecular beam epitaxy apparatus is used, the carbon insulating layer and the channel forming layer are formed in-situ with the chamber maintained in (or under) vacuum. As such, the manufactured material layers contain very few impurities, if any.

In addition, an insulating layer may be formed on a substrate, or on a material layer on which the insulating layer is difficult to be formed.

As described above, according to example embodiments, there is provided a method of fabricating a carbon insulating layer using molecular beam epitaxy, whereby an insulating layer may easily be formed on a substrate on which the insulating layer is difficult to be formed. In addition, with a chamber maintained in (or under) vacuum, the carbon insulating layer and a channel forming layer may be fabricated with substantially high purity.

It should be understood that the example embodiments described therein should be considered in a descriptive sense only and not for purposes of limitation. Descriptions of features or aspects within each example embodiment should typically be considered as available for other similar features or aspects in other example embodiments.

What is claimed is:

1. A method of fabricating a carbon insulating layer using molecular beam epitaxy, the method comprising:
    disposing a substrate in a molecular beam epitaxy chamber;
    maintaining the substrate at a temperature in a range of about 300° C. to about 500° C., and maintaining the chamber in a vacuum of $10^{-11}$ Torr or less, prior to performing an epitaxy process on the substrate; and
    supplying a carbon source into the chamber to form a carbon insulating layer on the substrate using the epitaxy process, the carbon insulating layer being formed of diamond-like carbon and tetrahedral amorphous carbon.

2. The method of claim 1, wherein the substrate is formed of at least one material selected from the group consisting of gallium arsenide (GaAs), gallium aluminium arsenide (GaAlAs), silicon (Si), magnesium oxide (MgO), silicon dioxide ($SiO_2$), sapphire and combinations thereof.

3. The method of claim 1, wherein the carbon source is at least one selected from the group consisting of carbon tetrabromide ($CBr_4$), ethylene ($C_2H_4$), carbon atoms, methane ($CH_4$) and combinations thereof.

4. The method of claim 3, wherein supplying the carbon source includes supplying the carbon source into the chamber while maintaining the chamber in a vacuum of about $10^{-8}$ Torr to about $10^{-9}$ Torr.

5. The method of claim 1, further comprising forming a second layer on the substrate or on the carbon insulating layer, the second layer being selected from the group consisting of a metal layer, a graphene layer and a semiconductor layer.

6. The method of claim 5, wherein the substrate is maintained at a temperature in a range of about 500° C. to about 800° C. when forming the second layer.

7. A method of fabricating a field effect transistor, the method comprising:
    disposing a substrate in a molecular beam epitaxy chamber;
    supplying a source for a channel forming layer into the chamber to form the channel forming layer on the substrate;

supplying a carbon source to the chamber to form a carbon insulating layer on the substrate, the carbon insulating layer being formed of diamond-like carbon and tetrahedral amorphous carbon;

removing the substrate from the chamber and subsequently patterning the carbon insulating layer to form a gate insulating layer;

forming a gate electrode on the gate insulating layer; and forming a source electrode and a drain electrode on opposing sides of a channel layer so as to contact respective ends of the channel layer, the channel layer being formed from the channel forming layer.

8. The method of claim 7, wherein the carbon insulating layer and the channel forming layer are sequentially patterned to form the gate insulating layer and the channel layer, after removing the substrate from the chamber and prior to forming the gate electrode.

9. The method of claim 7, wherein the substrate is formed of at least one material selected from the group consisting of gallium arsenide (GaAs), gallium aluminium arsenide (GaAlAs), silicon (Si), magnesium oxide (MgO), silicon dioxide ($SiO_2$), sapphire and combinations thereof.

10. The method of claim 7, wherein supplying the source for the channel forming layer includes maintaining the substrate at a temperature in a range of about 500° C. to about 800° C.; and supplying the source into the chamber to form a graphene layer on the substrate.

11. The method of claim 7, wherein supplying the carbon source to form the carbon insulating layer includes maintaining the substrate at a temperature in a range of about 300° C. to about 500° C.

12. The method of claim 11, wherein the carbon source is at least one selected from the group consisting of carbon tetrabromide ($CBr_4$), ethylene ($C_2H_4$), carbon atoms, methane ($CH_4$) and combinations thereof.

13. The method of claim 12, wherein supplying the carbon source to form the carbon insulating layer includes supplying the carbon source into the chamber while maintaining the chamber under a vacuum of about $10^{-8}$ Torr to about $10^{-9}$ Torr.

14. The method of claim 7, further comprising:

forming a conductive layer on the carbon insulating layer, after removing the substrate from the chamber and prior to patterning the carbon insulating layer; and sequentially patterning the conductive layer and the carbon insulating layer to form the gate electrode and the gate insulating layer.

15. The method of claim 14, wherein the substrate is formed of at least one material selected from the group consisting of GaAs, GaAlAs, Si, MgO, $SiO_2$, sapphire and combinations thereof.

16. The method of claim 14, wherein supplying the source for the channel forming layer includes maintaining the substrate at a temperature in a range of about 500° C. to about 800° C., and simultaneously supplying a Group III source and a Group V source into the chamber to form the channel forming layer on the substrate.

17. The method of claim 14, wherein supplying the carbon source to form the carbon insulating layer includes maintaining the substrate at a temperature in a range of about 300° C. to about 500° C.

18. The method of claim 17, wherein the carbon source is at least one selected from the group consisting of $CBr_4$, $C_2H_4$, carbon atoms, $CH_4$ and combinations thereof.

19. The method of claim 18, wherein supplying the carbon source to form the carbon insulating layer includes supplying the carbon source into the chamber while maintaining the chamber under a vacuum of about $10^{-8}$ Torr to about $10^{-9}$ Torr.

* * * * *